(12) United States Patent
Kim et al.

(10) Patent No.: US 10,685,977 B2
(45) Date of Patent: Jun. 16, 2020

(54) SEMICONDUCTOR MEMORY DEVICES

(71) Applicant: SAMSUNG ELECTRONICS CO., LTD., Suwon-si, Gyeonggi-Do (KR)

(72) Inventors: Jongwon Kim, Hwaseong-si (KR); Hyeong Park, Hwaseong-si (KR); Hyunmin Lee, Seoul (KR); Hojong Kang, Cheongju-si (KR); Joowon Park, Seoul (KR); Seungmin Song, Seoul (KR)

(73) Assignee: SAMSUNG ELECTRONICS CO., .LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/231,710

(22) Filed: Dec. 24, 2018

(65) Prior Publication Data

US 2019/0148403 A1    May 16, 2019

Related U.S. Application Data

(63) Continuation of application No. 15/059,993, filed on Mar. 3, 2016, now Pat. No. 10,186,519.

(30) Foreign Application Priority Data

Mar. 31, 2015  (KR) .......................... 10-2015-0045668
May 22, 2015   (KR) .......................... 10-2015-0071868

(51) Int. Cl.
*H01L 27/11582*  (2017.01)
*H01L 27/11565*  (2017.01)
*H01L 27/11575*  (2017.01)

(52) U.S. Cl.
CPC .. *H01L 27/11582* (2013.01); *H01L 27/11565* (2013.01); *H01L 27/11575* (2013.01)

(58) Field of Classification Search
CPC .......... H01L 27/1157; H01L 27/11582; H01L 23/5226; H01L 23/5283
See application file for complete search history.

(56) References Cited

U.S. PATENT DOCUMENTS

| | | |
|---|---|---|
| 7,936,004 B2 | 5/2011 | Kito et al. |
| 8,268,687 B2 | 9/2012 | Hyun et al. |
| 8,284,601 B2 | 10/2012 | Son et al. |

(Continued)

FOREIGN PATENT DOCUMENTS

| | | |
|---|---|---|
| JP | 2011049561 | 3/2011 |
| JP | 2015028989 | 2/2015 |

(Continued)

*Primary Examiner* — Christine A Enad
(74) *Attorney, Agent, or Firm* — F. Chau & Associates, LLC

(57) ABSTRACT

A semiconductor memory device includes a stack structure including gate electrodes vertically stacked on a substrate and a vertical channel part penetrating the gate electrodes, a bit line connected to the vertical channel part, and a plurality of conductive lines connected to the gate electrodes on the stack structure. The conductive lines form a plurality of stacked layers and include first conductive lines and second conductive lines. The number of the first conductive lines disposed at a first level from the substrate is different from the number of the second conductive lines disposed at a second level from the substrate. The first level is different from the second level.

12 Claims, 15 Drawing Sheets

(56) References Cited

U.S. PATENT DOCUMENTS

| | | |
|---|---|---|
| 8,492,831 B2 | 7/2013 | Hwang et al. |
| 8,724,390 B2 | 5/2014 | Hung et al. |
| 8,787,082 B2 | 7/2014 | Son et al. |
| 9,076,502 B2 | 7/2015 | Nakajima |
| 9,224,473 B1 | 12/2015 | Chen |
| 2012/0052674 A1* | 3/2012 | Lee .................. H01L 27/11578 438/591 |
| 2012/0280299 A1* | 11/2012 | Yun .................... H01L 27/1157 257/314 |
| 2014/0197546 A1 | 7/2014 | Hwang et al. |
| 2015/0001613 A1 | 1/2015 | Yip et al. |
| 2015/0036407 A1* | 2/2015 | Nakajima ............ H01Q 1/2283 365/63 |
| 2015/0162343 A1 | 6/2015 | Park et al. |
| 2016/0260733 A1* | 9/2016 | Lue .................. H01L 27/11582 |
| 2016/0293626 A1 | 10/2016 | Kim et al. |

FOREIGN PATENT DOCUMENTS

| | | |
|---|---|---|
| KR | 1020110009555 | 1/2011 |
| KR | 1020110048719 | 5/2011 |
| KR | 1020120084268 | 7/2012 |

* cited by examiner

SEMICONDUCTOR MEMORY DEVICES

CROSS-REFERENCE TO RELATED APPLICATION

This non-provisional patent application is a continuation of U.S. patent application Ser. No. 15/059,993 filed Mar. 3, 2016 which claims priority under 35 U.S.C. § 119 to Korean Patent Application No. 10-2015-0045668 filed on Mar. 31, 2015 and Korean Patent Application No. 10-2015-0071868, filed on May 22, 2015, in the Korean Intellectual Property Office, the disclosures of which are incorporated by reference in their entireties herein.

BACKGROUND

1. Technical Field

Embodiments of the inventive concept relate to semiconductor memory devices and, more particularly, to three-dimensional (3D) semiconductor memory devices.

2. Discussion of Related Art

Semiconductor devices have been highly integrated to provide high performance and low costs. In particular, the integration density of semiconductor memory devices may directly affect the manufacturing costs of the semiconductor memory devices. Since an integration density of a conventional two-dimensional (2D) memory device is mainly determined by the size of the area occupied by a unit memory cell, its manufacturing cost may be greatly affected by a technique chosen to form fine patterns. However, since apparatuses used to form these fine patterns are extremely expensive, it may not be fiscally possible to increase the integration density of 2D memory devices beyond a certain threshold.

A 3D semiconductor memory device including memory cells three-dimensionally arranged has been developed to reach higher integration densities. For example, the number of cell memory electrodes and the number of metal interconnections connected to the cell memory electrodes have been increased to improve the integration density of the 3D semiconductor memory device. However, it is difficult to arrange a great number of these metal interconnections in the limited area provided by a 3D semiconductor memory device.

SUMMARY

At least one embodiment of the inventive concepts may provide semiconductor memory devices with improved reliability.

According to an exemplary embodiment of the inventive concept, a semiconductor memory device includes a stack structure including gate electrodes vertically stacked on a substrate and a vertical channel part penetrating the gate electrodes, a bit line connected to the vertical channel part, and conductive lines connected to the gate electrodes on the stack structure. The conductive lines are arranged as a plurality of stacked layers and include first conductive lines and second conductive lines. The number of the first conductive lines disposed at a first level from the substrate is different from the number of the second conductive lines disposed at a second level from the substrate, and the first level is different from the second level.

In an embodiment, the second level is higher than the first level, and the number of the first conductive lines is smaller than the number of the second conductive lines.

In an embodiment, the second level is higher than the first level, and the number of the first conductive lines is larger than the number of the second conductive lines.

In an embodiment, the number of the first conductive lines is smaller than the number of the second conductive lines, and a pitch of the first conductive lines is greater than a pitch of the second conductive lines.

In an embodiment, a width of the first conductive line is greater than a width of the second conductive line, and a distance between the first conductive lines is greater than a distance between the second conductive lines.

In an embodiment, a width of the first conductive line is equal to a width of the second conductive line, and a distance between the first conductive lines is greater than a distance between the second conductive lines.

In an embodiment, the stack structure includes a plurality of stack structures, and the gate electrodes of each of the stack structures include a ground selection gate electrode of a ground selection transistor and cell gate electrodes. In this embodiment, the conductive lines may further include ground conductive lines connected to the ground selection gate electrodes of the plurality of stack structures. Further, in this embodiment, the ground conductive lines are disposed at a third level different from the first and second levels.

In an embodiment, the semiconductor memory device further include connection contacts disposed on the gate electrodes, respectively, first array pads connected to the connection contacts, respectively, first contacts respectively disposed on some of the first array pads and connected to the first conductive lines, respectively, buffer contacts respectively disposed on others of the first array pads, which are not provided with the first contacts, second array pads disposed on the buffer contacts, respectively, and second contacts disposed on the second array pads, respectively. In this embodiment, the second contacts are connected to the second conductive lines, respectively.

In an embodiment, the first contacts are arranged in a second direction diagonal to the one direction, and the second contacts may be arranged in the second direction. In this embodiment, the first contacts and the second contacts are arranged in parallel to each other when viewed from a plan view.

According to an exemplary embodiment of the inventive concept, a semiconductor memory device includes a stack structure including gate electrodes vertically stacked on a substrate; and a vertical channel part penetrating the gate electrodes, a bit line connected to the vertical channel part, and conductive lines connected to the gate electrodes on the stack structure. The conductive lines are arranged as a plurality of stacked layers and include first conductive lines and second conductive lines. A pitch of the first conductive lines is different from a pitch of the second conductive lines.

According to an exemplary embodiment of the inventive concept, a semiconductor device includes a plurality of gate electrodes vertically stacked on a substrate, a semiconductor pattern penetrating though all of the gate electrodes, a bit line connected to the semiconductor pattern, and a plurality of word lines connected to the gate lines. In this embodiment, the word lines include a first number of conductive lines and a second number of conductive lines, where the first number of lines is disposed at a first depth from the substrate that is different from a the second number of lines disposed at a second depth from the substrate, and the depths differ from one another.

BRIEF DESCRIPTION OF THE DRAWINGS

Exemplary embodiments of the inventive concept will become more apparent in view of the attached drawings and accompanying detailed description.

DETAILED DESCRIPTION OF THE EXEMPLARY EMBODIMENTS

Figure 1:
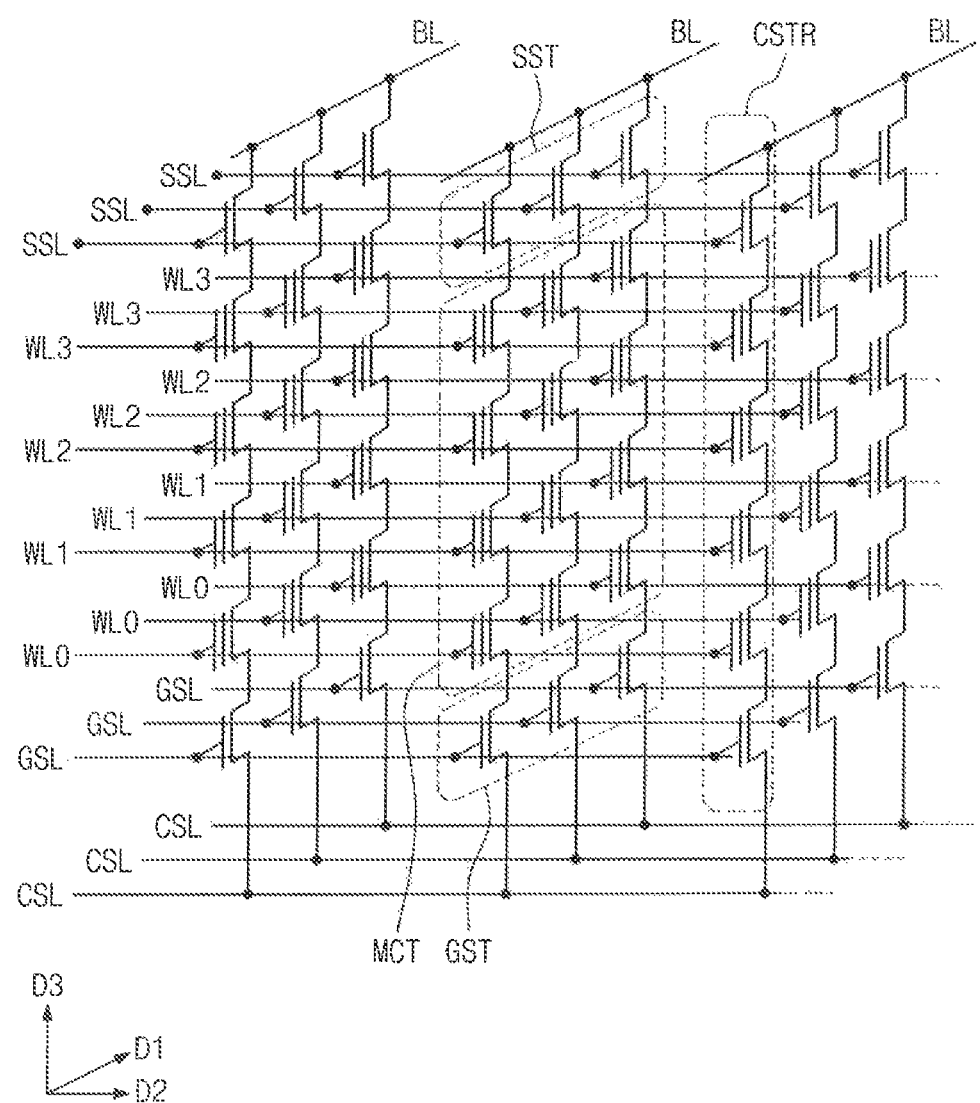
FIG. 1 is a schematic circuit diagram illustrating a cell array of a semiconductor memory device according to an exemplary embodiment of the inventive concept.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure. The term pitch described herein may refer to the distance between repeated elements in a structure.

FIG. 1 is a schematic circuit diagram illustrating a cell array of a semiconductor memory device according to an exemplary embodiment of the inventive concept. A cell array may also be referred to as a memory cell array.

Referring to FIG. 1, a cell array of a semiconductor memory device according to an exemplary embodiment of the inventive concept includes a common source line CSL, a plurality of bit lines BL, and a plurality of cell strings CSTR disposed between the common source line CSL and the bit lines BL.

The bit lines BL may be two-dimensionally arranged. A plurality of cell strings CSTR may be connected in parallel to each of the bit lines BL. The cell strings CSTR may be connected in common to the common source line CSL. In an exemplary embodiment, a plurality of the cell strings CSTR is connected between one common source line CSL and the plurality of bit lines BL. In an embodiment, the common source line CSL includes a plurality of common source lines CSL two-dimensionally arranged. In an embodiment, the same voltage is applied to the plurality of common source lines CSL. In an alternate embodiment, the common source lines CSL are electrically controlled independently of each other.

In an embodiment, each of the cell strings CSTR includes a ground selection transistor GST connected to the common source line CSL, a string selection transistor SST, and a plurality of memory cell transistors MCT connected between the ground and string selection transistors GST and SST. In an embodiment, the ground selection transistor GST, the memory cell transistors MCT, and the string selection transistor SST are connected in series.

In an embodiment, the common source line CSL is connected in common to source electrodes of the ground selection transistors GST. In an embodiment, a ground selection line GSL, a plurality of word lines WL0 to WL3, and a string selection line SSL, which are disposed between the common source line CSL and the bit lines, are used as gate electrodes of the ground selection transistor GST, the memory cell transistors MCT, and the string selection transistor SST, respectively. Each of the memory cell transistors MCT may include a data storage element.

Figure 2:
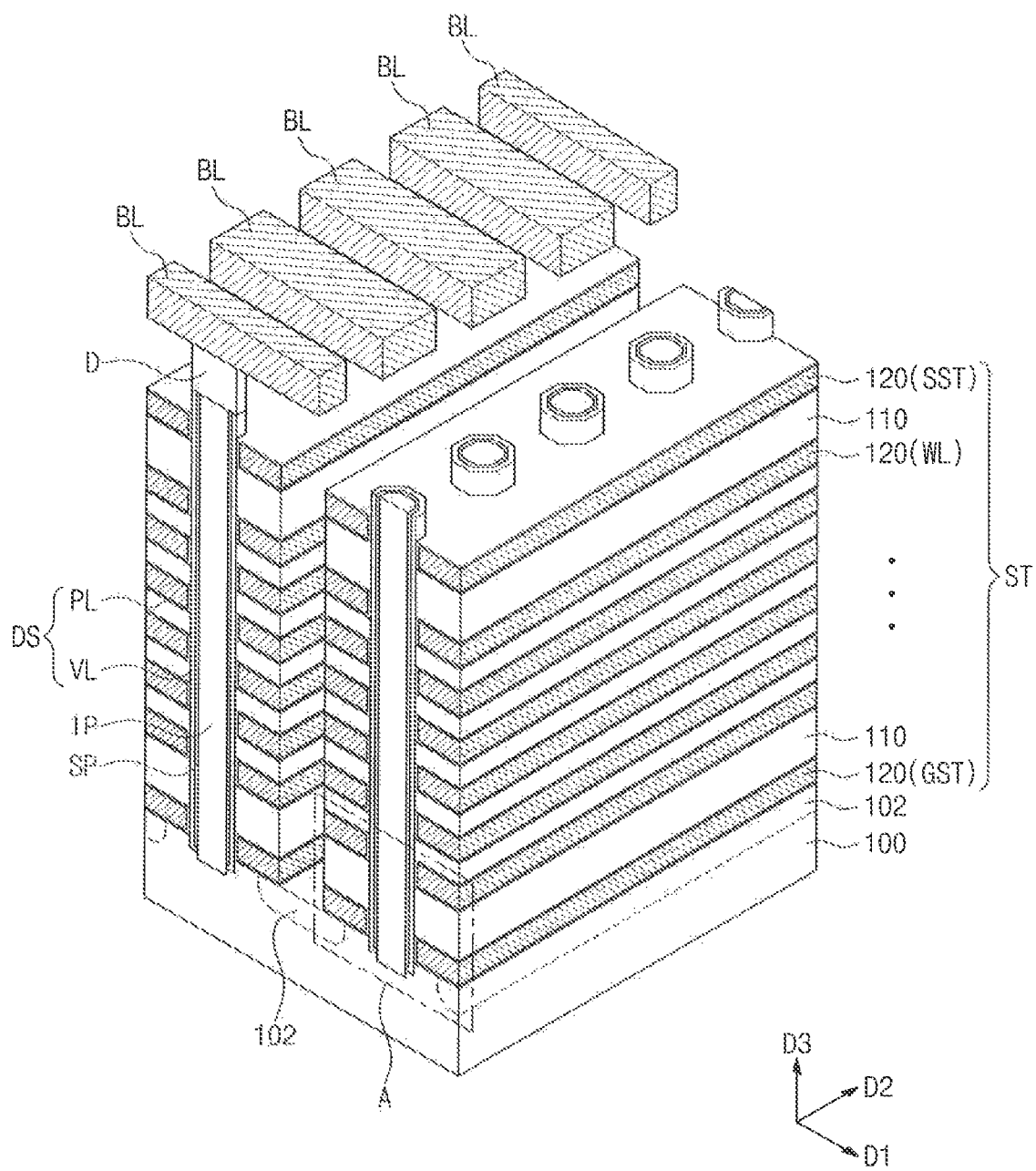
FIG. 2 is a perspective view illustrating a semiconductor memory device according to an exemplary embodiment of the inventive concept.
Figure 3:
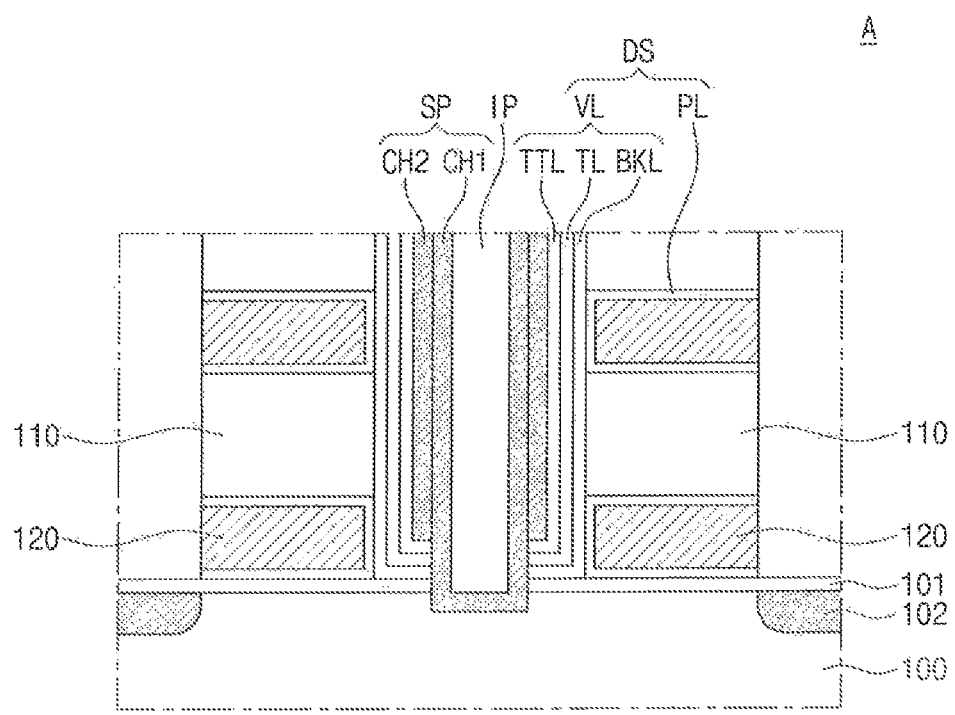
FIG. 3 is an enlarged view of a portion 'A' of FIG. 2 to illustrate a semiconductor memory device according to an exemplary embodiment of the inventive concept.
Figure 4:
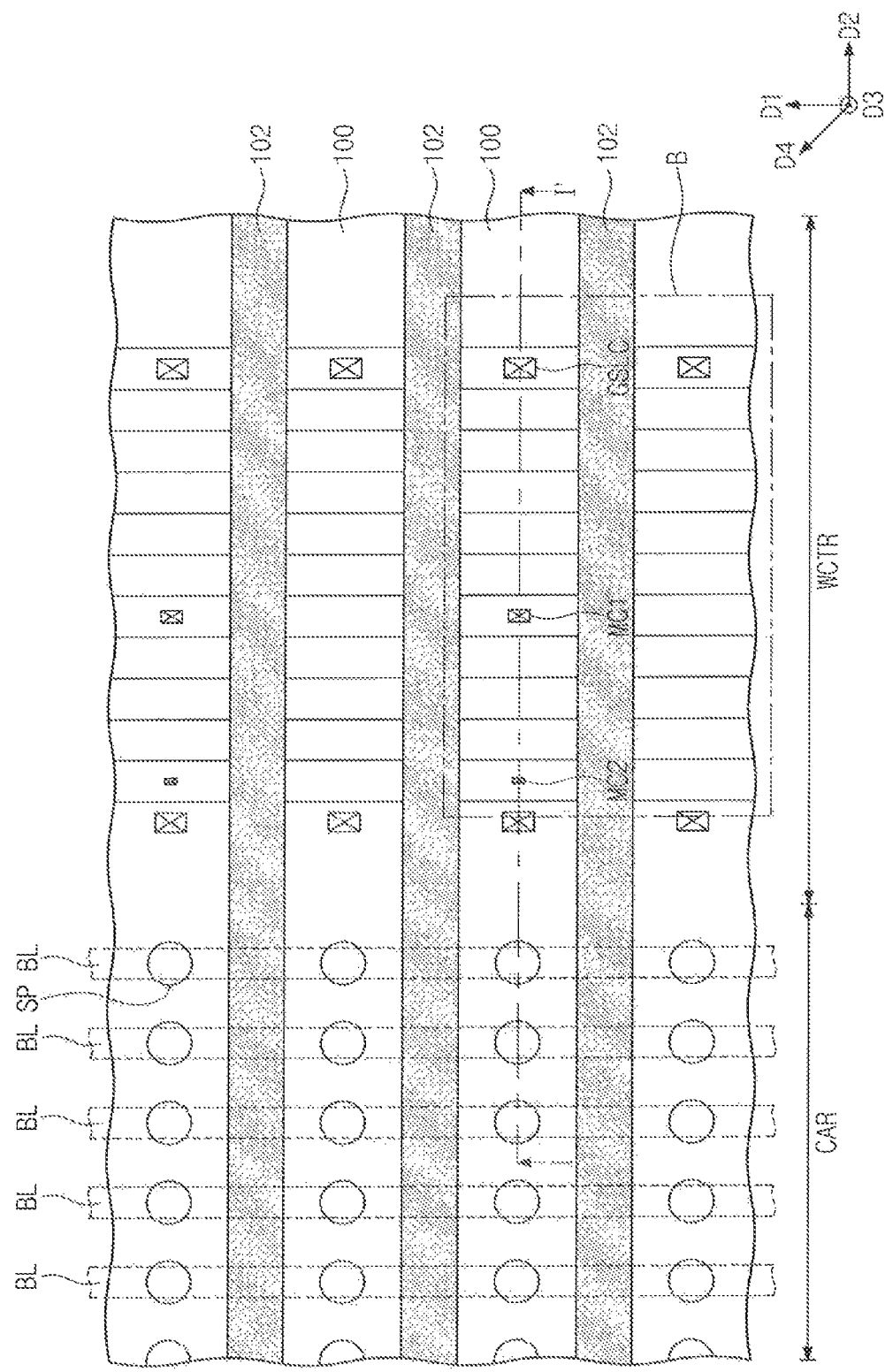
FIG. 4 is a plan view illustrating a semiconductor memory device according to an exemplary embodiment of the inventive concept.
Figure 5:
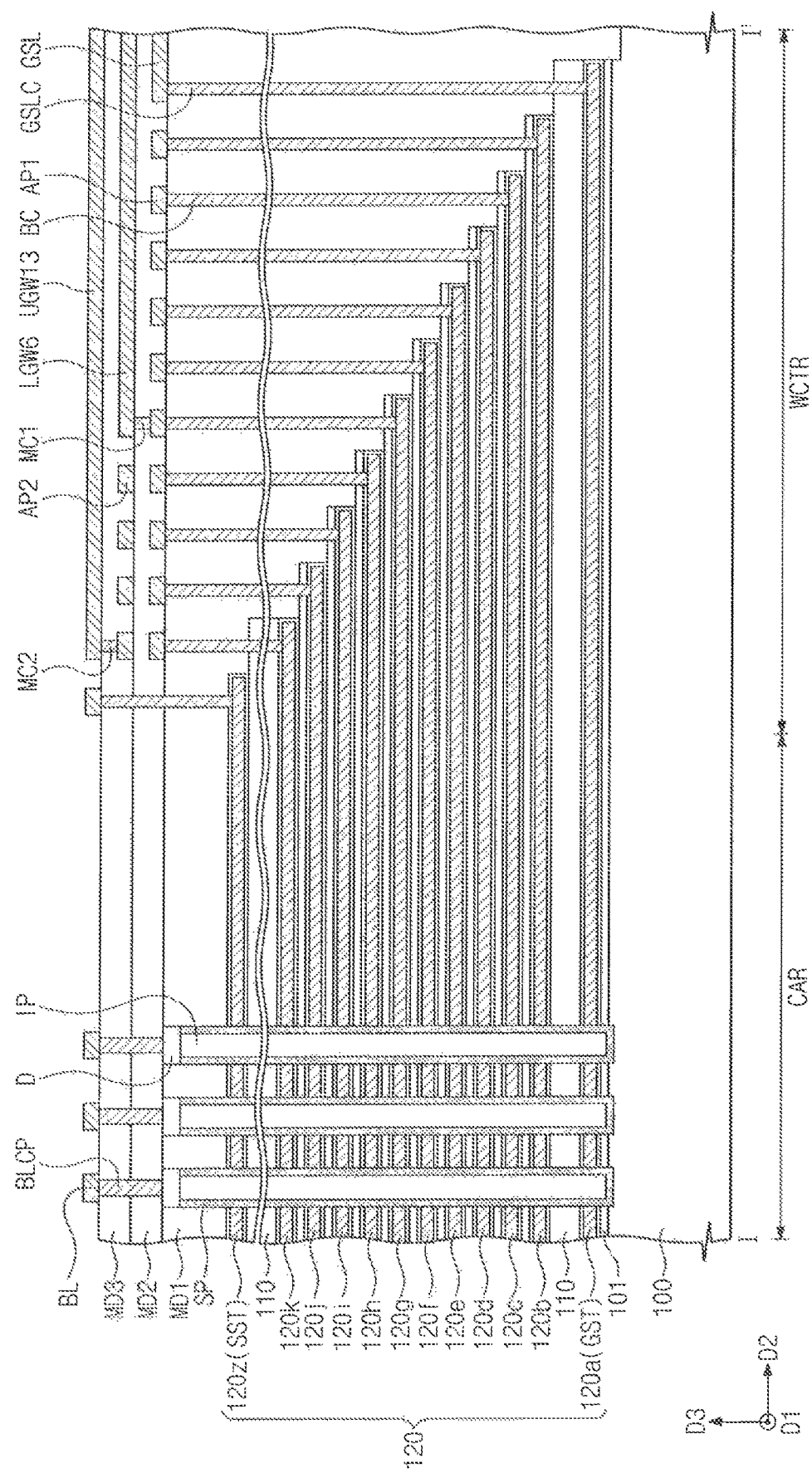
FIG. 5 is a cross-sectional view taken along a line I-I' of FIG. 4 to illustrate a semiconductor memory device according to an exemplary embodiment of the inventive concepts.
Figure 6A:
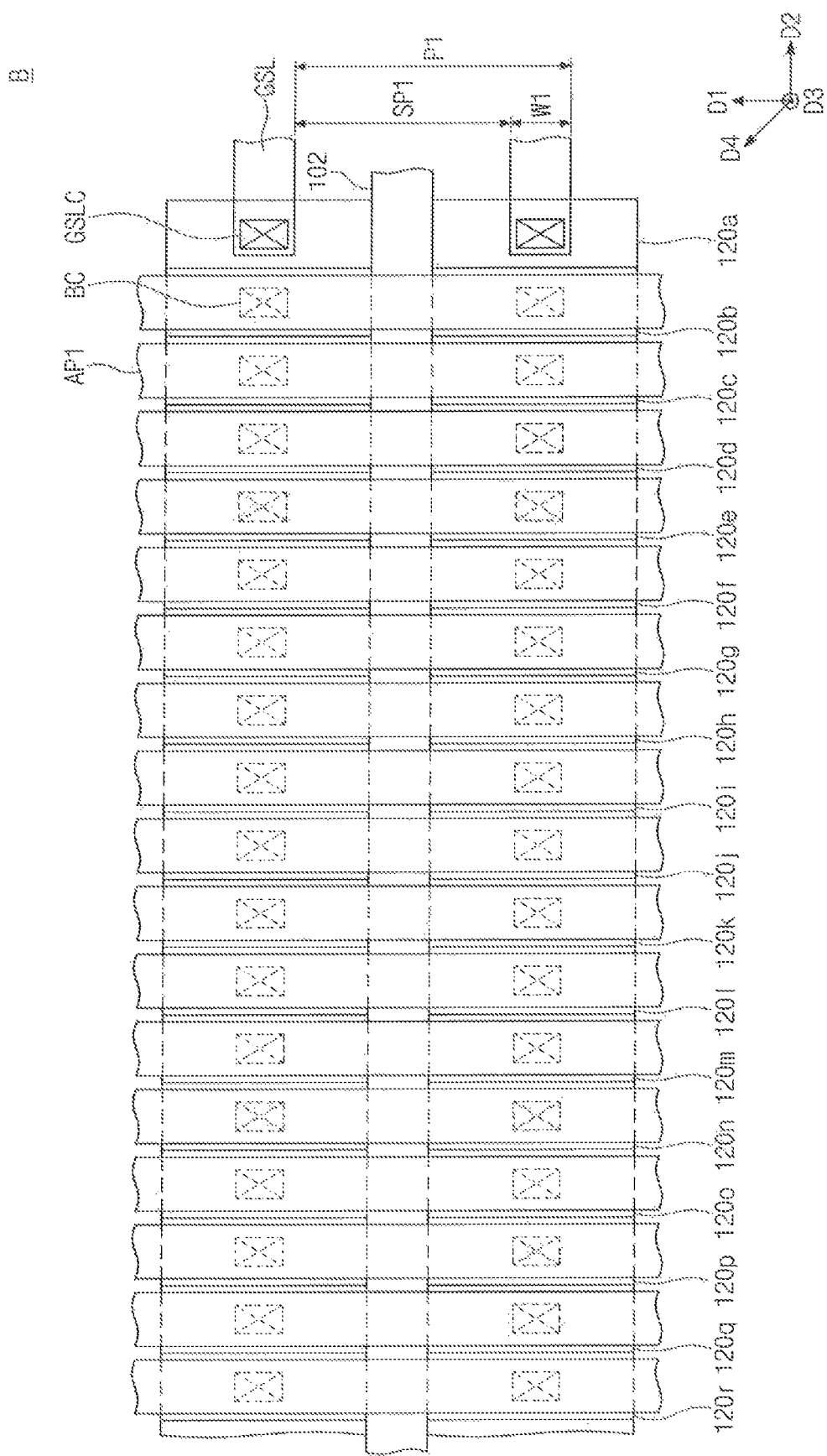
FIGS. 6A to 6C are enlarged plan views of a portion 'B' of FIG. 4 to illustrate a semiconductor memory device according to an exemplary embodiment of the inventive concept.
Figure 6B:
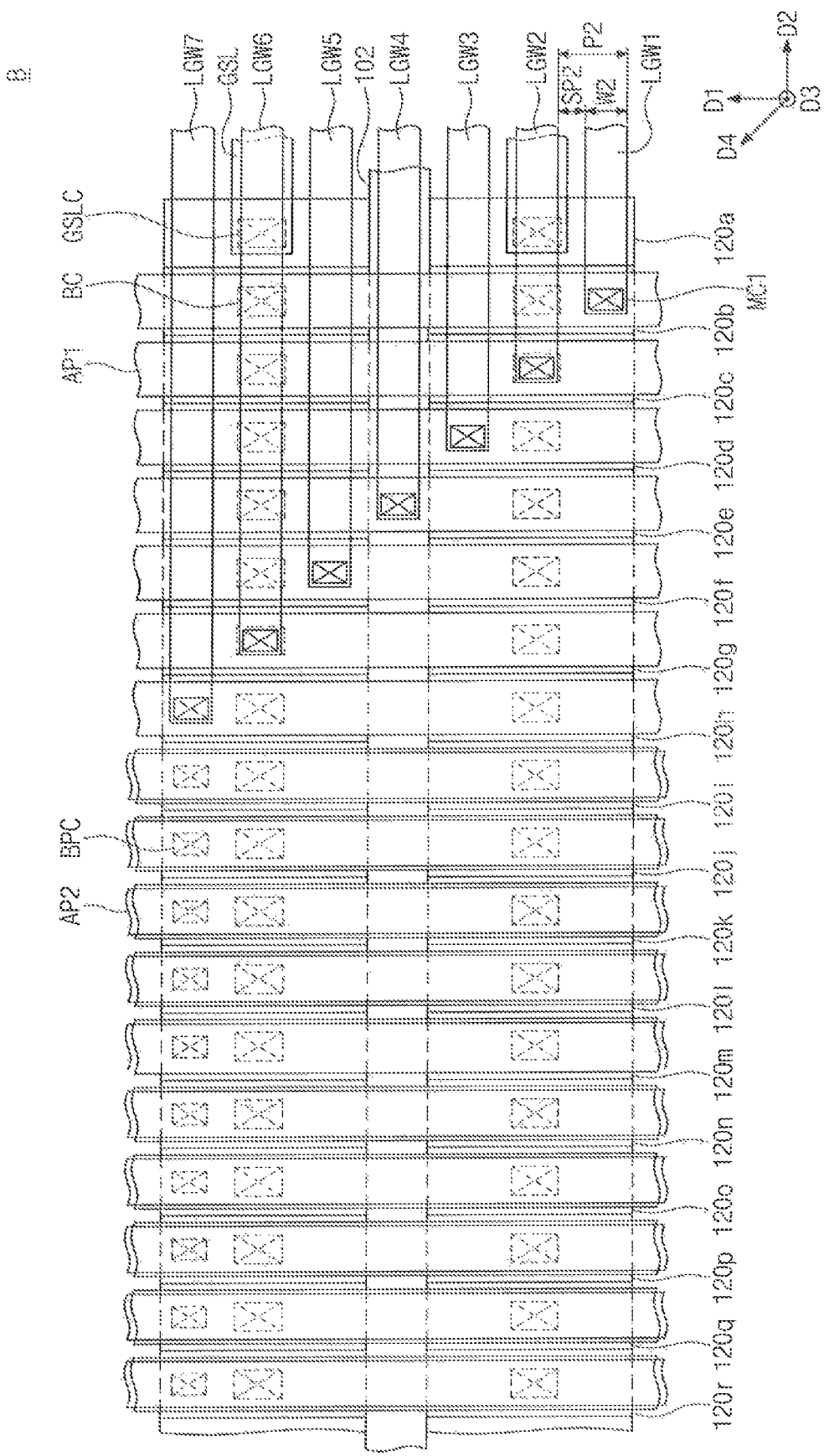
Figure 6C:
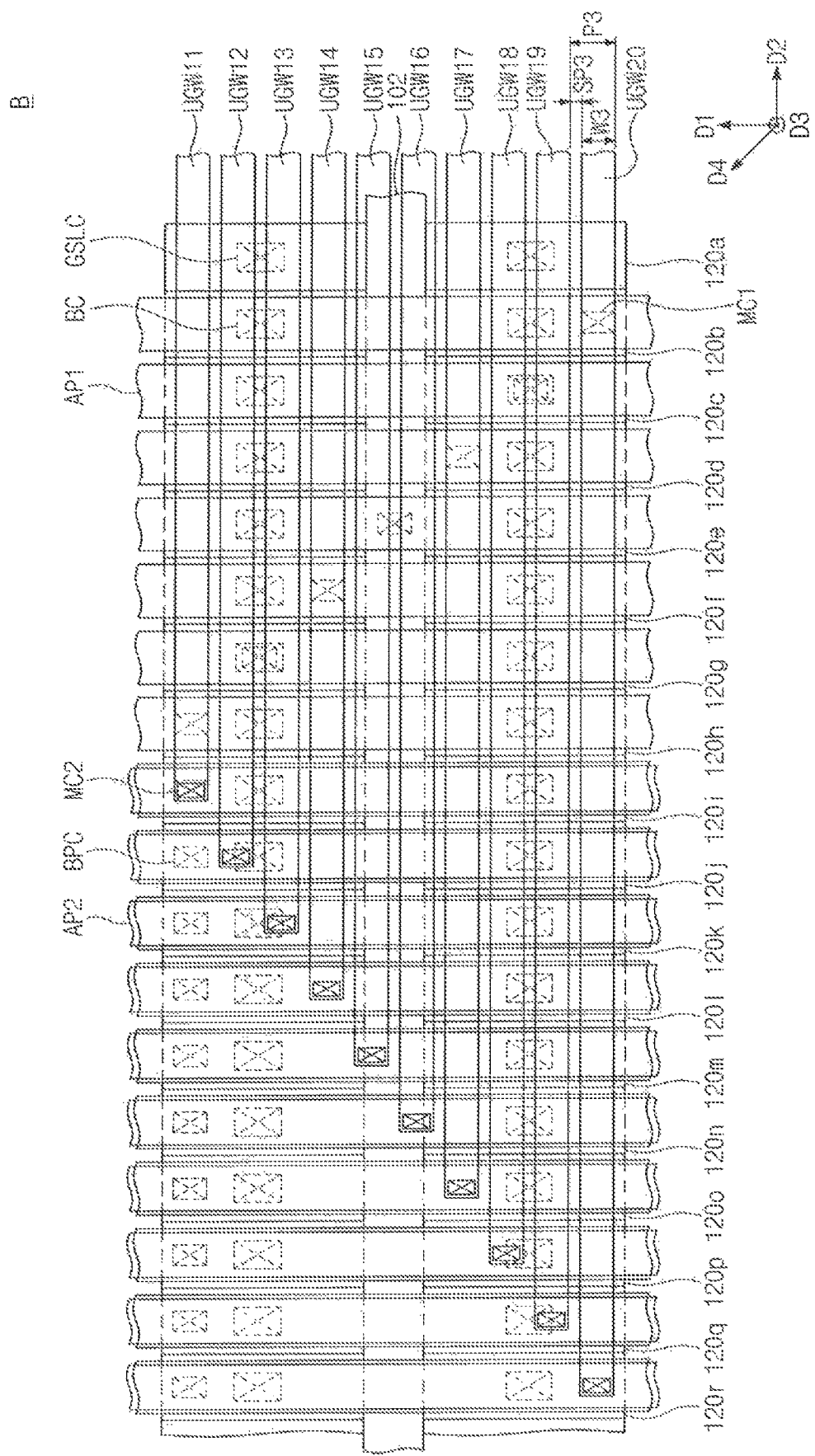

FIG. 2 is a perspective view illustrating a semiconductor memory device according to an exemplary embodiment of the inventive concept. FIG. 3 is an enlarged view of a portion 'A' of FIG. 2 to illustrate a semiconductor memory device according to an exemplary embodiment of the inventive concept. FIG. 4 is a plan view illustrating a semiconductor memory device according to an exemplary embodiment of the inventive concept. FIG. 5 is a cross-sectional view taken along a line I-I' of FIG. 4 to illustrate a semiconductor memory device according to an exemplary embodiment of the inventive concept. FIGS. 6A to 6C are enlarged plan views of a portion 'B' of FIG. 4 to illustrate a semiconductor memory device according to an exemplary embodiment of the inventive concept.

Referring to FIGS. 2 to 5, stack structures ST are disposed on a substrate 100. The stack structures ST extend in a second direction D2 intersecting a first direction D1 parallel to a top surface of the substrate 100. The stack structures ST are disposed on a cell array region CAR and a contact region WCTR of the substrate 100. The substrate 100 may be a silicon substrate, a silicon-germanium substrate, a germanium substrate, or an epitaxial layer grown on a single-crystalline silicon substrate. The cell array region CAR is adjacent to the contact region WCTR.

A dopant region 102 is located in the substrate 100 between the stack structures ST. The dopant region 102 extends along the second direction D2 in the substrate 100. In an embodiment, the dopant region 102 corresponds to a common source line (e.g., CSL). In this embodiment, a conductivity type of the dopant region 102 is different from that of the substrate 100. For example, if the conductivity type of the substrate 100 is n-type, then the conductivity type of the dopant region 102 would be p-type.

Each of the stack structures ST includes insulating patterns 110 stacked on the substrate 100, and gate electrodes 120 disposed between the insulating patterns 110. For example, the insulating patterns 110 and the gate electrodes 120 may be alternately and repeatedly stacked on the substrate 100. The insulating patterns 110 and the gate electrodes 120 are interleaved with one another. A buffer insulating layer 101 of FIG. 3 may be provided between the stack structure ST and the substrate 100. For example, the buffer insulating layer 101 may be located between the bottommost gate electrode 120 and the substrate 100. The buffer insulating layer 101 may include, for example, a silicon oxide layer.

The gate electrodes 120 may be stacked in a third direction D3 perpendicular to the top surface of the substrate 100 and may extend in the second direction D2. In an embodiment, lengths of the gate electrodes 120 in the second direction D2 are different from each other. For example, the lengths of the gate electrodes 120 may be sequentially decreased as a distance from the substrate 100 is increased. In other words, the stacked gate electrodes 120 disposed on the contact region WCTR of the substrate 100 may have a stepped structure. Thus, in an exemplary embodiment, end portions of the gate electrodes 120 are exposed on the contact region WCTR of the substrate 100.

In an embodiment, the gate electrodes 120 include a ground selection gate electrode of a ground selection transistor GST, cell gate electrodes, and a string selection gate electrode of a string selection transistor SST which are sequentially stacked on the substrate 100. As illustrated in FIG. 5, the lowermost gate electrode 120a is the ground selection gate electrode of the ground selection transistor GST, and the uppermost gate electrode 120z is the string selection gate electrode of the string selection transistor SST. The cell gate electrodes may be provided between the ground selection gate electrode of the ground selection transistor GST and the string selection gate electrode of the string selection transistor SST. In an embodiment, the gate electrodes 120 include a conductive material. For example, the gate electrodes 120 may include at least one of a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum).

The insulating patterns 110 provided between the gate electrodes 120 may extend in the second direction D2. In an embodiment, lengths of the insulating patterns 110 in the second direction D2 are different from each other. For example, the lengths of the insulating patterns 110 may be sequentially decreased as a distance from the substrate 100 is increased. In an embodiment, each of the insulating patterns 110 has the same length as the gate electrode 120 disposed immediately below each of the insulating patterns 110. For example, the lowermost insulating pattern 110 may have the same length as the lowermost gate electrode 120a in the second direction D2. Thus, in an exemplary embodiment, the insulating patterns 110 respectively cover the exposed end portions of the gate electrodes 120 on the contact region WCTR of the substrate 100.

Thicknesses of the insulating patterns 110 may be varied according to characteristics of the semiconductor memory device. For example, in an exemplary embodiment, the thicknesses of the lowermost insulating pattern 110 and the uppermost insulating pattern 110 are greater than those of other insulating patterns 110. For example, the insulating patterns 110 may include silicon oxide.

In an embodiment, semiconductor patterns SP penetrate each of the stack structures ST in the third direction D3 perpendicular to the top surface of the substrate 100. In an embodiment, the semiconductor patterns SP penetrates the insulating patterns 110 and the gate electrodes 120 so as to be in contact with the substrate 100. The semiconductor patterns SP may correspond to vertical channel parts. In an embodiment, the semiconductor patterns SP form an active channel of a transistor. The semiconductor patterns SP may be arranged in the second direction D2. For example, the semiconductor patterns SP may be arranged in a linear form or a zigzag form (not shown) when viewed from a plan view. In an embodiment, each of the semiconductor patterns SP covers a portion of the top surface of the substrate 100 and inner sidewalls of the insulating patterns 110 and the gate electrodes 120.

As illustrated in FIG. 3, each of the semiconductor patterns SP includes a first channel pattern CH1 and a second channel pattern CH2. The first channel pattern CH1 may have a hollow pipe shape, a hollow cylindrical shape, or a cup shape. The first channel pattern CH1 may have a closed bottom end. A bottom surface of the first channel pattern CH1 is in contact with the substrate 100 and may be provided in the substrate 100. For example, the first channel pattern CH1 may penetrate the substrate 100. In an embodiment, the second channel pattern CH2 is disposed on an outer sidewall of the first channel pattern CH1 and has a vertical wall. For example, the first channel pattern CH1 may be shaped like a vertical line or rectangle. In an embodiment, the second channel pattern CH2 is in contact with the outer sidewall of the first channel pattern CH1.

Although not shown in the drawings, the semiconductor pattern SP may have a pillar shape or a cylindrical shape in an embodiment of the inventive concept.

The semiconductor patterns SP may be formed of a semiconductor doped with dopants or an intrinsic semiconductor not doped with dopants. In an embodiment, the semiconductor patterns SP has at least one crystal structure selected from a group consisting of a single-crystalline structure, an amorphous structure, and a poly-crystalline structure.

A vertical insulating layer VL is located between the stack structure ST and each of the semiconductor patterns SP. The vertical insulating layer VL may be a single-layer or multilayer including at least one of a silicon oxide layer, a silicon nitride layer, or a silicon oxynitride layer. For example, the vertical insulating layer VL may include a blocking insulating layer BKL, a trap insulating layer TL, and a tunnel insulating layer TTL which are sequentially stacked on the inner sidewalls of the gate electrodes 120. For example, the blocking insulating layer BKL may be a silicon oxide layer, the trap insulating layer TL may be a silicon nitride layer, and the tunnel insulating layer TTL may be a silicon oxide layer. In an embodiment, the trap insulating layer TL is in direct contact with the blocking insulating layer BKL and the tunnel insulating layer TTL.

A horizontal insulating layer PL may be disposed between the vertical insulating layer VL and each of the gate electrodes 120. In an embodiment, the horizontal insulating layer PL conformally covers the inner sidewall, a top surface and a bottom surface of the gate electrode 120. For example, the horizontal insulating layer PL may surround several sides of the gate electrode 120 to prevent it from contacting the block insulating layer BKL or a gate insulating layer 110. The horizontal insulating layer PL may include, for example, a silicon oxide layer. The vertical insulating layer VL and the horizontal insulating layer PL may constitute a charge storage layer DS.

An insulating pillar IP may fill an inner space surrounded by each of the semiconductor patterns SP. For example, the insulating pillar IP may include at least one of a silicon oxide layer, a silicon nitride layer, or a silicon oxynitride layer.

Referring again to FIGS. 2, 4, and 5, a conductive pad D is disposed on each of the semiconductor patterns SP. In an embodiment, the conductive pad D includes a conductive material, or a semiconductor material doped with dopants of which a conductivity type is different from that of the semiconductor pattern SP. A first interlayer insulating layer MD1 exposing top surfaces of the conductive pads D may be formed on the substrate 100. For example, the first interlayer insulating layer MD1 is formed so that it does not cover the top surface of the conductive pads D. For example, the first interlayer insulating layer MD1 may include a silicon oxide layer. In an embodiment, a bit line contact plug BLCP is disposed on the conductive pad D, and a bit line BL is disposed on the bit line contact plug BLCP. In an embodiment, the bit line contact plugs BLCP are formed from a conductive material. A plurality of the bit lines BL may intersect the stack structures ST in the first direction D1. In an embodiment, the bit lines BL are electrically connected to the semiconductor patterns SP through the bit line contact plugs BLCP and the conductive pads D. Each of the bit lines BL may be electrically connected to the semiconductor patterns SP arranged in the first direction D1. The bit lines BL may include a conductive material (e.g., tungsten or copper).

Referring to FIGS. 4, 5, and 6A, the gate electrodes 120 include the ground selection gate electrode 120a of a ground selection transistor, the cell gate electrodes 120b to 120r, and the string selection gate electrode 120z of a string selection transistor. In an embodiment, the ground selection gate electrodes 120a of the stack structures are separated from each other by a trench (not shown) exposing the dopant region 102 extending in the second direction D2. Thus, the ground selection gate electrodes 120a may be arranged along the first direction D1. The cell gate electrodes 120b to 120r of each of the stack structures ST may be stacked in the direction (i.e., the third direction D3) perpendicular to the top surface of the substrate 100. The cell gate electrodes (one of 120b to 120r) that are respectively included in the stack structures ST and are disposed at the same level or a same distance away from the substrate (e.g., a particular depth) may be separated from each other by the trench (not shown) exposing the dopant region 102. Thus, the cell gate electrodes 120 (one of 120b to 120r) disposed at the same level or depth may be arranged along the first direction D1.

In an embodiment, ground selection contacts GSLC penetrate the first interlayer insulating layer MD1 and the lowermost insulating pattern 110 of the contact region WCTR so as to be in contact with the end portions of the ground selection gate electrodes 120a, respectively. In an embodiment, ground selection lines GSL are disposed on the first interlayer insulating layer MD1 so as to be in contact with the ground selection contacts GSLC, respectively. The ground selection lines GSL may be arranged along the first direction D1 and may extend in the second direction D2. The ground selection lines GSL may be disposed at the same level or depth.

A pitch P1 of the ground selection lines GSL adjacent to each other is a sum of a width W1 of one ground selection line GSL and a distance SP1 between the adjacent ground selection lines GSL (P1=W1+SP1). The ground selection lines GSL may include, for example, tungsten (W).

In an embodiment, connection contacts BC penetrate the first interlayer insulating layer MD1 and the insulating patterns 110 of the contact region WCTR so as to be in contact with the end portions of the cell gate electrodes 120b to 120r, respectively. The connection contacts BC of each of the stack structures ST may be arranged in the second direction D2. Since the cell gate electrodes 120b to 120r are disposed at levels or depths different from each other, the connection contacts BC may have heights different from each other. In other words, top surfaces of the connection contacts BC may be disposed at the same level or depth, but bottom surfaces of the connection contacts BC may be disposed at levels or depths different from each other.

In an embodiment, first array pads AP1 are disposed on the connection contacts BC. In an embodiment, the first array pads AP1 are formed from a conductive material. Each of the first array pads AP1 may be connected to a plurality of the connection contacts BC arranged in the first direction D1. For example, each of the first array pads AP1 may be in contact with a pair of the connection contacts BC arranged in the first direction D1. The first array pads AP1 may be arranged along the second direction D2 and may intersect the cell gate electrodes 120b to 120r of the stack structures ST facing each other in the first direction D1.

In an embodiment, a second interlayer insulating layer MD2 is located on the first interlayer insulating layer MD1 and covers the ground selection lines GSL and the first array pads AP1. For example, the second interlayer insulating layer MD2 may include at least one of a silicon oxide layer or a silicon nitride layer.

Referring to FIGS. 5 and 6B, first contacts MC1 and buffer contacts BPC penetrate the second interlayer insulating layer MD2 of the contact region WCTR so as to be in contact with the first array pads AP1. The first contact MC1 may be respectively disposed on the first array pads AP1 connected to first to seventh cell gate electrodes 120b to 120h. In an embodiment, the first contacts MC1 are arranged not to horizontally overlap with each other in the second direction D2. In an embodiment, the first contacts MC1 are arranged in a fourth direction D4 diagonal to the first and second directions D1 and D2. In an embodiment, planar areas of the first contact MC1 and the buffer contact BPC are smaller than planar areas of the ground selection contacts GSLC.

The buffer contacts BPC may be respectively disposed on the first array pads AP1 connected to eighth to seventeenth cell gate electrodes 120i to 120r. In FIG. 6B, the buffer contacts BPC are arranged to horizontally overlap with each other in the second direction D2. However, the inventive concept is not limited thereto. In an embodiment, the buffer contacts BPC do not horizontally overlap with each other in the second direction D2.

The number of the first contacts MC1, the number of the buffer contacts BPC, and the number of the ground selection contacts GSLC may be different from each other. In an embodiment, the number of the first contacts MC1 is larger than the number of the ground selection contacts GSLC and smaller than the number of the buffer contacts BPC.

First to seventh lower word lines LGW1 to LGW7 may be disposed on the second interlayer insulating layer MD2 so as to be connected to the first contacts MC1, respectively. Thus, the first to seventh lower word lines LGW1 to LGW7 may be electrically connected to the first to seventh cell gate electrodes 120b to 120h, respectively. The first to seventh lower word lines LGW1 to LGW7 may extend in the second direction D2 and may be arranged in the first direction D1. Since the first contacts MC1 do not horizontally overlap with each other in the second direction D2, the first to seventh lower word lines LGW1 to LGW7 also do not horizontally overlap with each other in the second direction D2. Lengths of the first to seventh lower word lines LGW1 to LGW7 in the second direction D2 may be different from each other. The first to seventh lower word lines LGW1 to LGW7 may include, for example, tungsten (W).

In an embodiment, the first to seventh lower word lines LGW1 to LGW7 are disposed at the same level or depth as each other and are disposed at a higher level or depth than the ground selection lines GSL. The number of the first to seventh lower word lines LGW1 to LGW7 may be different from the number of the ground selection lines GSL. In an embodiment, the number of the first to seventh lower word lines LGW1 to LGW7 is larger than the number of the ground selection lines GSL. In an embodiment, at least one of the first to seventh lower word lines LGW1 to LGW7 does not vertically overlap with any one of the ground selection lines GSL vertically adjacent to the lower word lines LGW1 to LGW7.

A pitch P2 of adjacent lines of the first to seventh lower word lines LGW1 to LGW7 is a sum of a width W2 of one lower word line and a distance SP2 between the adjacent lower word lines (P2=W2+SP2). In an embodiment, the width W2 of the lower word lines LGW1 to LGW7 is smaller than the width W1 of the ground selection lines GSL (W2<W1). In an embodiment, the distance SP2 between the lower word lines LGW1 to LGW7 is smaller than the distance SP1 between the ground selection lines GSL (SP2<SP1). Thus, the pitch P2 of the lower word lines LGW1 to LGW7 is smaller than the pitch P1 of the ground selection lines GSL (P2<P1).

Second array pads AP2 are disposed on the second interlayer insulating layer MD2 so as to be in contact with the buffer contacts BPC. The second array pads AP2 may intersect the eighth to seventeenth cell gate electrodes 120i to 120r of a pair of the stack structures facing each other in the first direction D1. The second array pads AP2 may be arranged in the second direction D2. In an embodiment, the second array pads AP2 are disposed at the same level or depth as the first to seventh lower word lines LGW1 to LGW7 and are disposed at a higher level or depth than the first array pads AP1.

In an embodiment, a third interlayer insulating layer MD3 is disposed on the second interlayer insulating layer MD2 to cover the first to seventh lower word lines LGW1 to LGW7 and the second array pads AP2. For example, the third interlayer insulating layer MD3 may include at least one of a silicon oxide layer or a silicon nitride layer.

Referring to FIGS. 5 and 6C, in an exemplary embodiment, second contacts MC2 penetrate the third interlayer insulating layer MD3 of the contact region WCTR so as to be in contact with the second array pads AP2, respectively. In an embodiment, the second contacts MC2 are arranged such that they do not horizontally overlap with each other in the second direction D2. The second contacts MC2 may be arranged in a direction different from the arrangement direction of the first contacts MC1 when viewed from a plan view. For example, the arrangement direction of the second contacts MC2 and the arrangement direction (i.e., the fourth direction D4) of the first contacts MC1 may be symmetrical with respect to the first direction D1.

Figure 7:
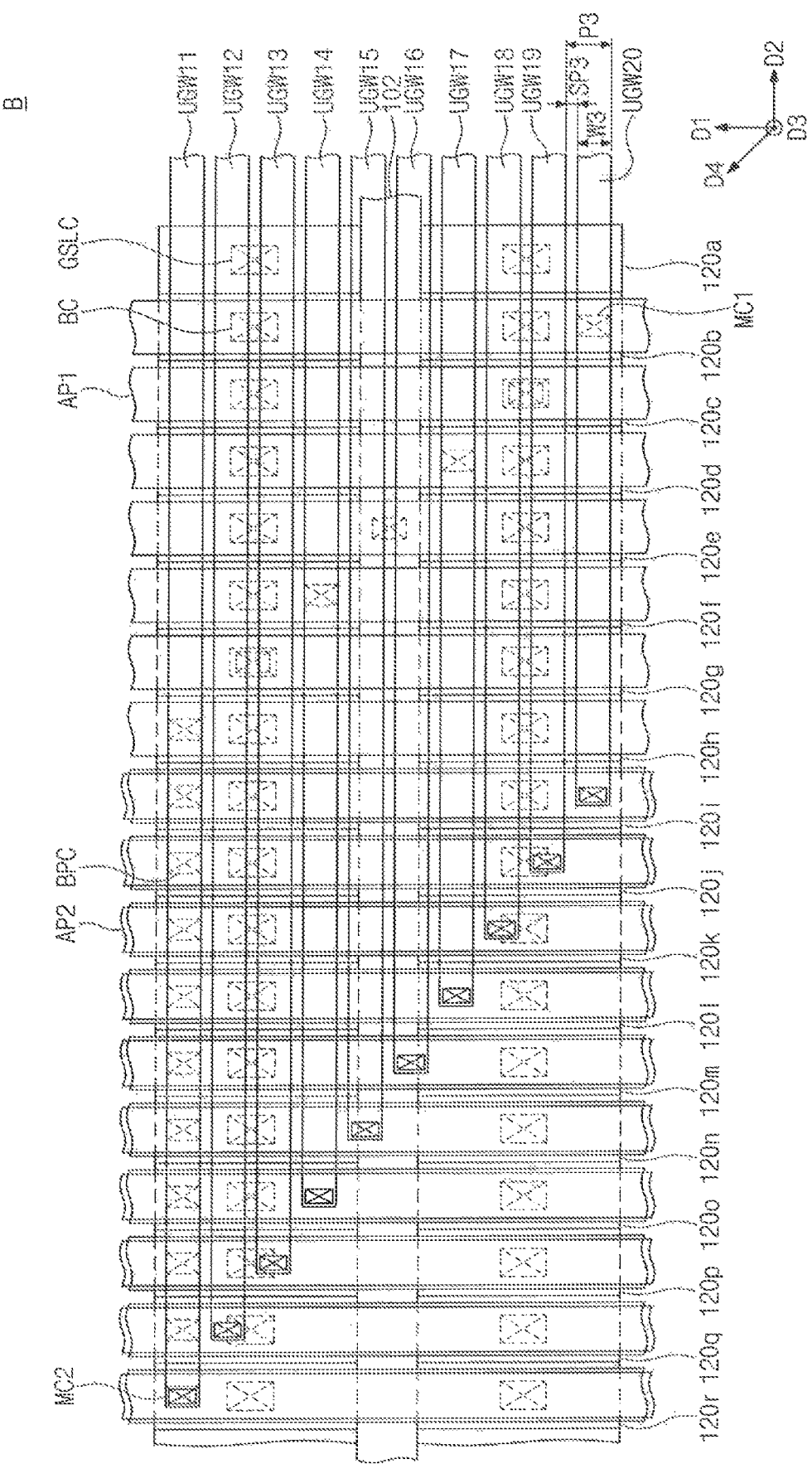
FIG. 7 is an enlarged plan view of a portion 'B' of FIG. 4 to illustrate a semiconductor memory device according to an exemplary embodiment of the inventive concept.

According to an embodiment illustrated in FIG. 7, the second contacts MC2 are arranged in the substantially same direction as the arrangement direction of the first contacts MC1 when viewed from a plan view. For example, the second contacts MC2 may be arranged in the fourth direction D4. Thus, the first contacts MC1 and the second contacts MC2 may be arranged in parallel to each other when viewed from a plan view. In an embodiment, planar areas of the second contacts MC2 are smaller than planar areas of the first contacts MC1.

Referring again to FIGS. 5 and 6C, the number of the second contacts MC2 may be different from the number of the first contacts MC1. In an embodiment, the number of the second contacts MC2 is larger than the number of the first contacts MC1.

First to tenth upper word lines UGW11 to UGW20 may be disposed on the third interlayer insulating layer MD3 so as to be connected to the second contacts MC2. The first to tenth upper word lines UGW11 to UGW20 may be electrically connected to the eighth to seventeenth cell gate electrodes 120i to 120r, respectively. The first to tenth upper word lines UGW11 to UGW20 may extend in the second direction D2 and may be arranged along the first direction D1. Since the second contacts MC2 do not horizontally overlap with each other in the second direction D2, the first to tenth upper word lines UGW11 to UGW20 also do not horizontally overlap with each other in the second direction D2. Lengths of the first to tenth upper word lines UGW11 to UGW20 in the second direction D2 may be different from each other.

The first to tenth upper word lines UGW11 to UGW20 may be disposed at the same level or depth as each other and may be disposed at a higher level or depth than the first to seventh lower word lines LGW1 to LGW7. The number of the upper word lines UGW11 to UGW20 may be different from the number of the lower word lines LGW1 to LGW7. In an embodiment, the number of the upper word lines UGW11 to UGW20 is larger than the number of the lower word lines LGW1 to LGW7. At least one of the first to tenth upper word lines UGW11 to UGW20 does not vertically overlap with one of the first to seventh lower word lines LGW1 to LGW7 vertically adjacent to the upper word lines UGW11 to UGW20.

A pitch P3 of adjacent lines of the first to tenth upper word lines UGW11 to UGW20 is a sum of a width W3 of one upper word line and a distance SP3 between the adjacent upper word lines (P3=W3+SP3). In an embodiment, the width W3 of the upper word lines UGW11 to UGW20 is smaller than the width W2 of the lower word lines LGW1 to LGW7 (W3<W2). In an embodiment, the distance SP3 between the upper word lines UGW11 to UGW20 is smaller than the distance SP2 between the lower word lines LGW1 to LGW7 (SP3<SP2). Thus, the pitch P3 of the adjacent upper word lines UGW11 to UGW20 is smaller than the pitch P2 of the adjacent lower word lines LGW1 to LGW7 (P3<P2).

Since the width W3 of the upper word lines UGW11 to UGW20 is smaller than the width W2 of the lower word lines LGW1 to LGW7, a resistance value of the upper word lines UGW11 to UGW20 is greater than that of the lower word lines LGW1 to LGW7. Thus, the upper word lines UGW11 to UGW20 may be formed of a different metal from the lower word lines LGW1 to LGW7. For example, the upper word lines UGW11 to UGW20 may include copper (Cu).

Figure 8:
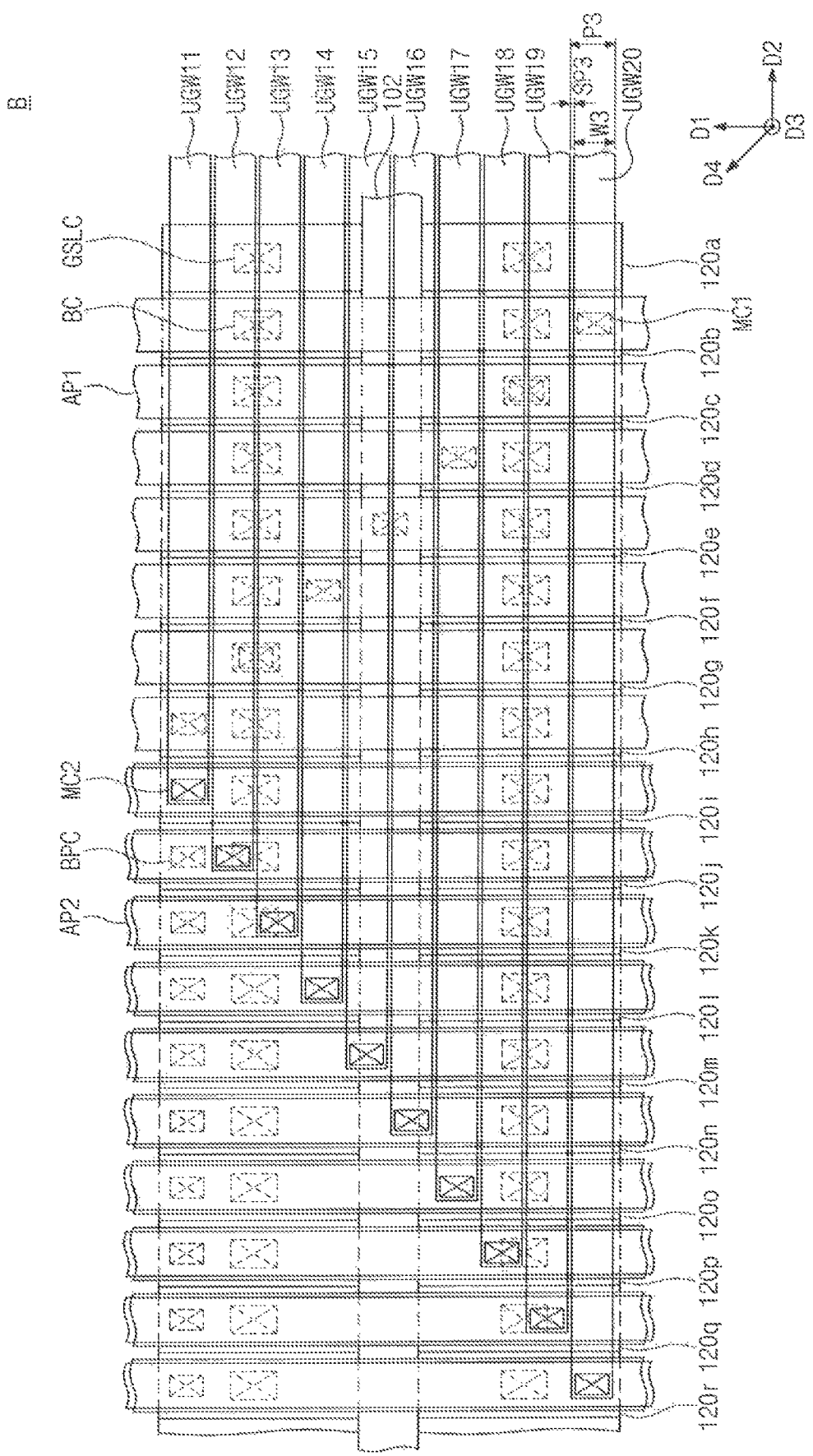
FIG. 8 is an enlarged plan view of a portion 'B' of FIG. 4 to illustrate a semiconductor memory device according to an exemplary embodiment of the inventive concept.

According to an embodiment illustrated in FIG. 8, the width W3 of the upper word lines UGW11 to UGW20 is equal to the width W2 of the lower word lines LGW1 to LGW7 (W3=W2). In this embodiment, the distance SP3 between the upper word lines UGW11 to UGW20 is smaller than the distance SP2 between lower word lines LGW1 to LGW7 (SP3<SP2). Since the number of the upper word lines UGW11 to UGW20 is larger than the number of the lower word lines LGW1 to LGW7 even though the width W3 of the upper word lines UGW11 to UGW20 is equal to the width W2 of the lower word lines LGW1 to LGW7, the pitch P3 of the upper word lines UGW11 to UGW20 is smaller than the pitch P2 of the lower word lines LGW1 to LGW7 (P2>P3). In an embodiment where the width W3 of the upper word lines UGW11 to UGW20 is equal to the width W2 of the lower word lines LGW1 to LGW7, the upper word lines UGW11 to UGW20 include the same material as the lower word lines LGW1 to LGW7. In this embodiment, the upper word lines UGW11 to UGW20 may include, for example, tungsten (W).

According to an exemplary embodiment of the inventive concept, the word lines corresponding to interconnections connected to the cell gate electrodes are disposed to have a multi-layered structure. In addition, the number of the word lines disposed at a first level or depth may be different from the number of the word lines disposed at a second level different from the first level. Thus, even though the number of the interconnections connected to the cell gate electrodes increases when integration density of a semiconductor memory device increases, the number of interconnections need not be limited by the amount of available space. As a result, reliability of the semiconductor memory device may be improved.

Figure 9A:
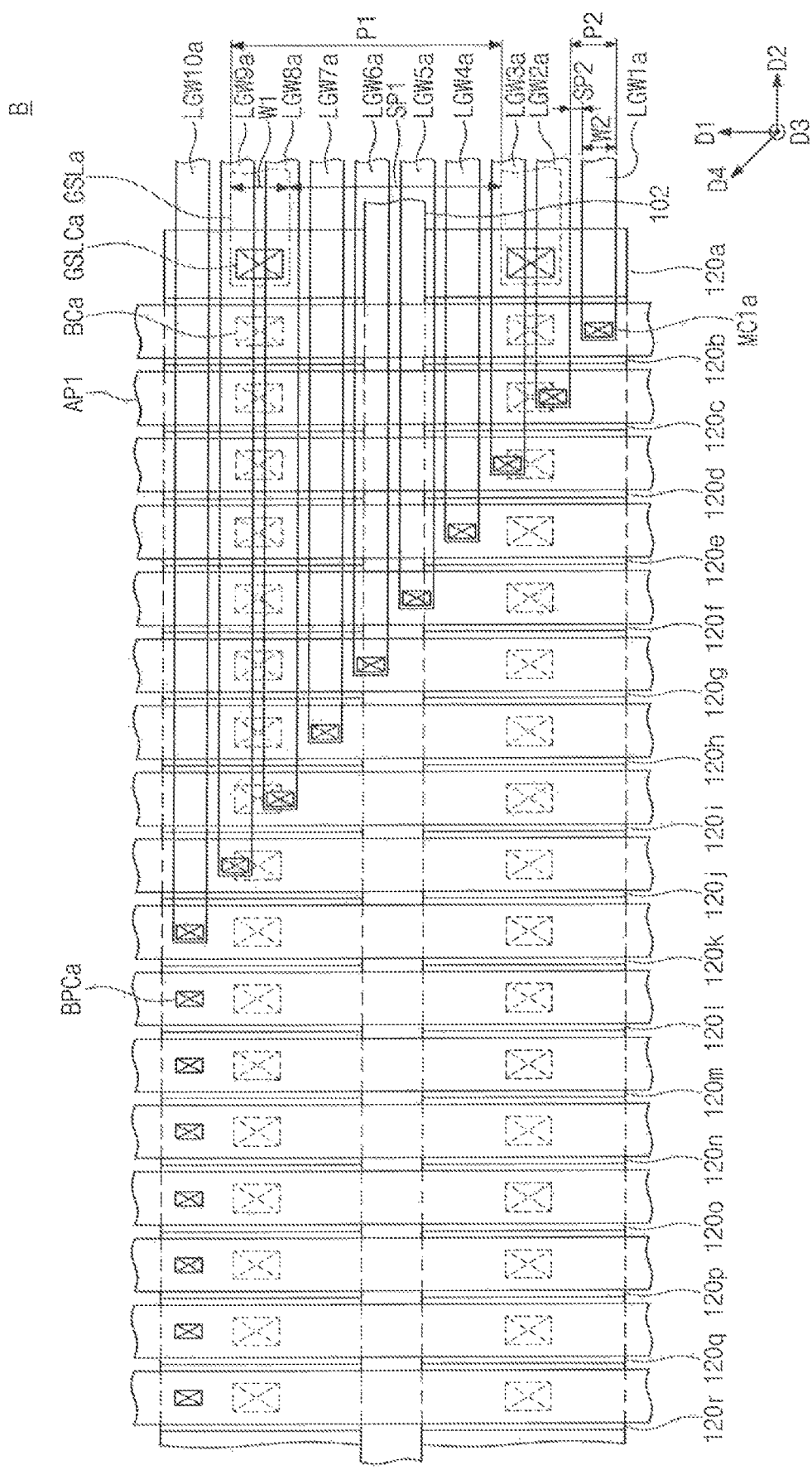
FIGS. 9A and 9B are enlarged plan views of a portion 'B' of FIG. 4 to illustrate a semiconductor memory device according to an exemplary embodiment of the inventive concept.
Figure 9B:
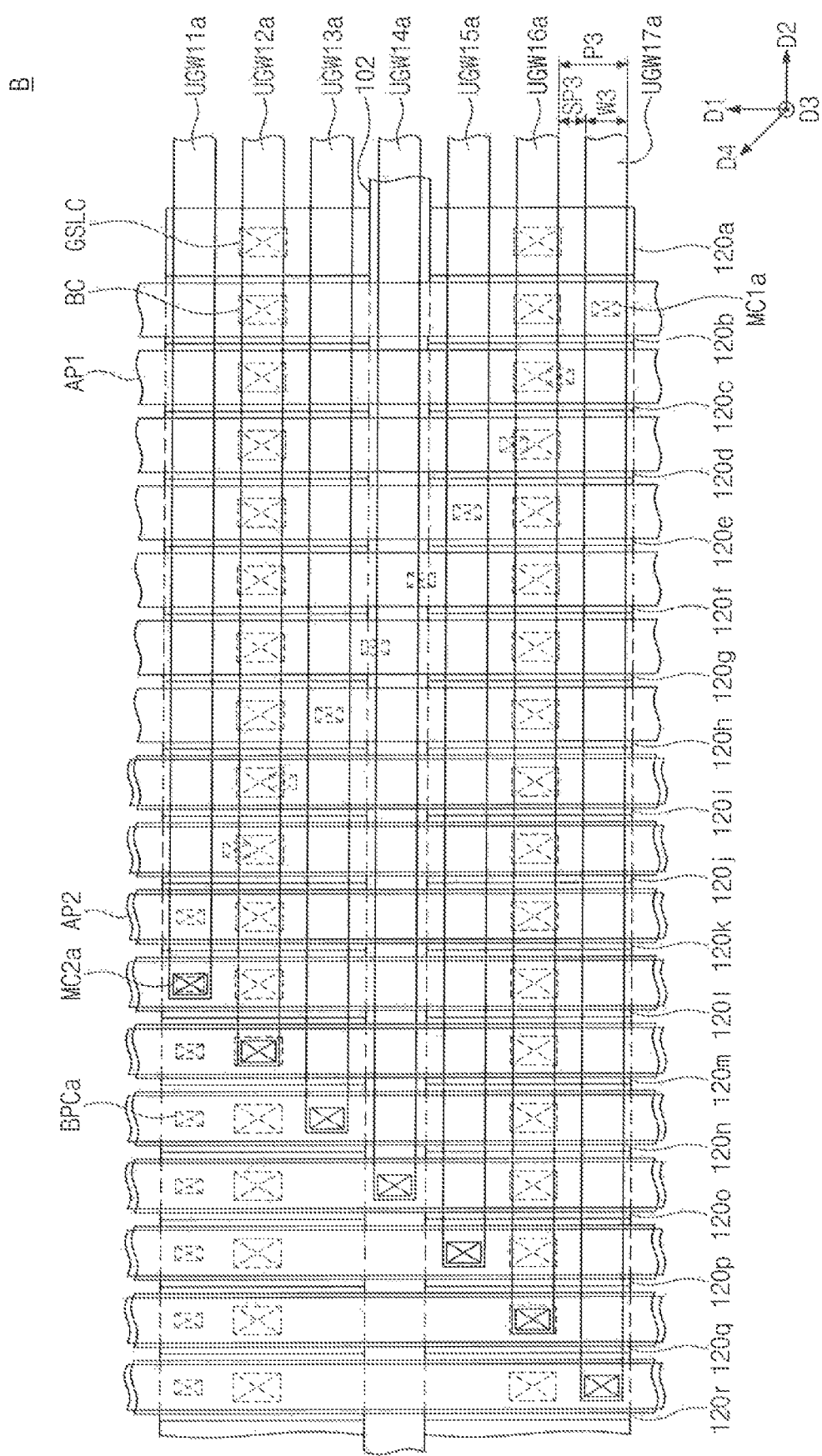

FIGS. 9A and 9B are enlarged plan views of a portion 'B' of FIG. 4 to illustrate a semiconductor memory device according to an exemplary embodiment of the inventive concept.

Referring to FIGS. 4, 5, and 9A, ground selection contacts GSLCa and connection contacts BCa penetrate the first interlayer insulating layer MD1 and the insulating patterns 110 on the contact region WCTR of the substrate 100. In an embodiment, the ground selection contacts GSLCa are in contact with the end portions of the ground selection gate electrodes 120a, respectively, and the connection contacts BCa are in contact with the end portions of the cell gate electrodes 120b to 120r, respectively.

In an embodiment, ground selection lines GSLa extending in the second direction D2 are formed on the first interlayer insulating layer MD1 so as to be connected to the ground selection contacts GSLCa, respectively. In an embodiment, first array pads AP1 are disposed on the first interlayer insulating layer MD1 so as to be connected to the connection contacts BCa. Each of the first array pads AP1 may be connected to a pair of the connection contacts BCa arranged in the first direction D1. The ground selection lines GSLa may be arranged in the first direction D1, and the first array pads AP1 may be arranged in the second direction D2. A pitch P1 of the ground selection lines GSLa adjacent to each other is a sum of a width W1 of one ground selection line GSLa and a distance SP1 between the adjacent ground selection lines GSLa (P1=W1+SP1).

In an embodiment, the first contacts MC1a and the buffer contacts BPCa penetrate the second interlayer insulating layer MD2 so as to be in contact with the first array pads AP1, respectively. The first contacts MC1a may be disposed on the first array pads AP1 connected to first to tenth cell gate electrodes 120b to 120k, respectively. In an embodiment, the first contacts MC1a do not horizontally overlap with each other in the second direction D2. In an embodiment, the first contacts MC1a are arranged in the fourth direction D4 diagonal to the first and second directions D1 and D2.

The buffer contacts BPCa may be disposed on the first array pads AP1 connected to eleventh to seventeenth cell gate electrodes 120l to 120r, respectively. The buffer contacts BPCa may be arranged such that they horizontally overlap with each other in the second direction D2. However, the inventive concept is not limited thereto. In an embodiment, the buffer contacts BPCa do not overlap with each other in the second direction D2.

The first contacts MC1a, the buffer contacts BPCa, and the ground selection contacts GSLCa may be different in number from each other. In an embodiment, the number of the first contacts MC1a is larger than the number of the ground selection contacts GSLCa and the number of the buffer contacts BPCa.

First to tenth lower word lines LGW1a to LGW10a may be disposed on the second interlayer insulating layer MD2 so as to be connected to the first contacts MC1a, respectively. The first to tenth lower word lines LGW1a to LGW10a may be electrically connected to the first to tenth cell gate electrodes 120b to 120k through the first contacts MC1a, respectively. The first to tenth lower word lines LGW1a to LGW10a may extend in the second direction D2 and may be arranged in the first direction D1. Since the first contacts MC1a do not horizontally overlap with each other in the second direction D2, the first to tenth lower word lines LGW1a to LGW10a also do not horizontally overlap with each other in the second direction D2. The first to tenth lower word lines LGW1a to LGW10a may have lengths different from each other in the second direction D2. For example, the first to tenth lower word lines LGW1a to LGW10a may include tungsten (W).

The first to tenth lower word lines LGW1a to LGW10a may be disposed at the same level or depth as each other and may be disposed at a higher level or depth than the ground selection lines GSLa. The number of the lower word lines LGW1a to LGW10a may be different from the number of the ground selection lines GSLa. In an embodiment, the number of the lower word lines LGW1a to LGW10a is larger than the number of the ground selection lines GSLa. In an embodiment, at least one of the first to tenth lower word lines LGW1a to LGW10a does not vertically overlap with one of the ground selection lines GSLa vertically adjacent to the lower word lines LGW1a to LGW10a.

A pitch P2 of adjacent lines of the first to tenth lower word lines LGW1a to LGW10a is a sum of a width W2 of one lower word line and a distance SP2 between the adjacent lower word lines (P2=W2+SP2). In an embodiment, the width W2 of the lower word lines LGW1a to LGW10a is smaller than the width W1 of the ground selection lines GSLa (W2<W1). In an embodiment, the distance SP2 between the lower word lines LGW1a to LGW10a is smaller than the distance SP1 between the ground selection lines GSLa (SP2<SP1). Thus, the pitch P2 of the lower word lines LGW1a to LGW10a is smaller than the pitch P1 of the ground selection lines GSLa (P2<P1).

Referring to FIGS. 4, 5, and 9B, in an embodiment, second array pads AP2 are disposed on the second interlayer insulating layer MD2 and are in contact with the buffer contacts BPCa. In an embodiment, the second array pads AP2 are formed from a conductive material. The second array pads AP2 may intersect eleventh to seventeenth cell gate electrodes 120l to 120r of the stack structures ST facing each other in the first direction D1 and may be arranged in the second direction D2. The second array pads AP2 may be disposed at the same level or depth as the first to tenth lower word lines LGW1a to LGW10a.

In an embodiment, a third interlayer insulating layer MD3 is disposed on the second interlayer insulating layer MD2 to cover the first to tenth lower word lines LGW1a to LGW10a and the second array pads AP2.

Second contacts MC2a penetrate the third interlayer insulating layer MD3 of the contact region WCTR of the substrate 100 so as to be in contact with the second array pads AP2, respectively. The second contacts MC2a may be arranged such that they do not horizontally overlap with each other in the second direction D2. The second contacts MC2a may be arranged in a direction different from the arrangement direction of the first contacts MC1a when viewed from a plan view. For example, the arrangement direction of the second contacts MC2a and the arrangement direction (i.e., the fourth direction D4) of the first contacts MC1a may be symmetrical with respect to the first direction D1.

The number of the second contacts MC2a may be different from the number of the first contacts MC1a. In an embodiment, the number of the second contacts MC2a is smaller than the number of the first contacts MC1a.

First to seventh upper word lines UGW11a to UGW17a may be disposed on the third interlayer insulating layer MD3 so as to connected to the second contacts MC2a. The first to seventh upper word lines UGW11a to UGW17a may be electrically connected to the eleventh to seventeenth cell gate electrodes 120l to 120r, respectively. The first to seventh upper word lines UGW11a to UGW17a may extend in the second direction D2 and may be arranged along the first direction D1. Since the second contacts MC2a do not horizontally overlap with each other in the second direction D2, the first to seventh upper word lines UGW11a to UGW17a also do not horizontally overlap with each other in the second direction D2. Lengths of the first to seventh upper word lines UGW11a to UGW17a in the second direction D2 may be different from each other.

The first to seventh upper word lines UGW11a to UGW17a may be disposed at the same level or depth as each other and may be disposed at a higher level or depth than the first to tenth lower word lines LGW1a to LGW10a. The number of the upper word lines UGW11a to UGW17a may be different from the number of the lower word lines LGW1a to LGW10a. In an embodiment, the number of the upper word lines UGW11a to UGW17a is smaller than the number of the lower word lines LGW1a to LGW10a.

A pitch P3 of adjacent lines of the first to seventh upper word lines UGW11a to UGW17a is a sum of a width W3 of one upper word line and a distance SP3 between the adjacent upper word lines (P3=W3+SP3). In an embodiment, the width W3 of the upper word lines UGW11a to UGW17a is greater than the width W2 of the lower word lines LGW1a to LGW10a (W3>W2). In an embodiment, the distance SP3 between the upper word lines UGW11a to UGW17a is greater than the distance SP2 between the lower word lines LGW1a to LGW10a (SP3>SP2). Thus, the pitch P3 of the adjacent upper word lines UGW11a to UGW17a is greater than the pitch P2 of the adjacent lower word lines LGW1a to LGW10a (P3>P2).

Figure 10:
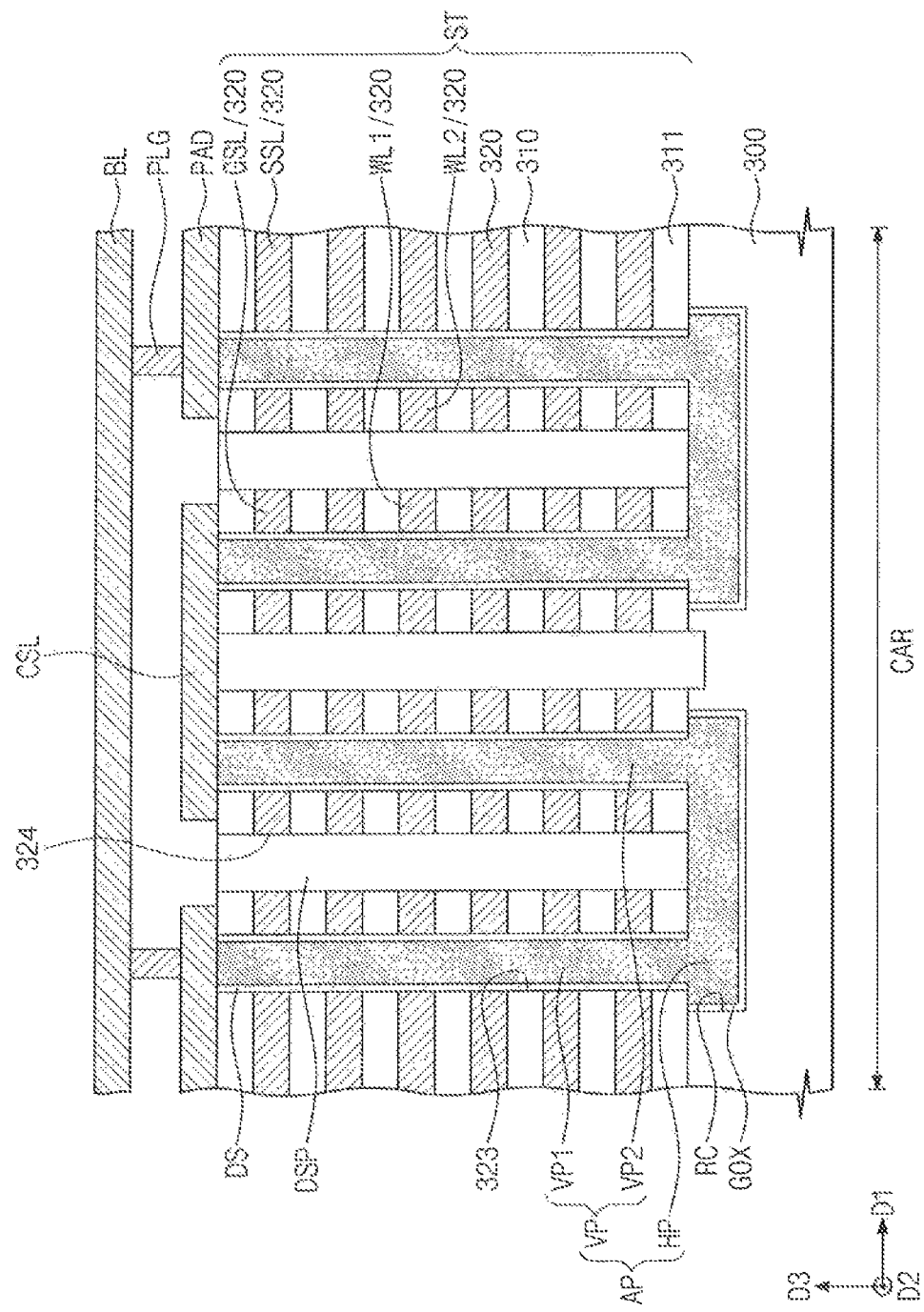
FIG. 10 is a cross-sectional view corresponding to a cell array region of FIGS. 4 and 5 to illustrate a semiconductor memory device according to an exemplary embodiment of the inventive concept.

FIG. 10 is a cross-sectional view corresponding to a cell array region CAR of FIGS. 4 and 5 to illustrate a semiconductor memory device according to an exemplary embodiment of the inventive concept.

Referring to FIG. 10, a semiconductor memory device according to the present embodiment includes stack structures ST disposed on the substrate 300. A common source line CSL is disposed on the stack structures ST. The stack structures ST may extend in a second direction D2 intersecting a first direction D1 parallel to a top surface of the substrate 300. Each of the stack structures ST includes insulating patterns 310 and gate electrodes 320 which are alternately stacked on the substrate 300. For example, the insulating patterns 310 and the gate electrodes 320 are interleaved with one another. A buffer insulating layer 311 is disposed between the substrate 300 and the lowermost insulating pattern 310. The gate electrodes 320 may include doped silicon, a metal (e.g., tungsten), a metal nitride, a metal silicide, or any combination thereof. The insulating patterns 310 and the buffer insulating layer 311 may include silicon oxide.

The insulating patterns 310 and the gate electrodes 320 may be alternately and repeatedly stacked on the substrate 300. The gate electrodes 320 of the stack structures ST may include a ground selection line GSL, word lines, and a string selection line SSL. The ground selection line GSL and the string selection line SSL may be laterally spaced apart from each other in the first direction D1 by a separation trench 324. For example, the word lines may include first and second word lines WL1 and WL2. The first and second word lines WL1 and WL2 may be laterally spaced apart from each other in the first direction D1 by the separation trench 324. In an embodiment, the word lines include the first word lines WL1 provided between the substrate 300 and the ground selection line GSL, and the second word lines WL2 provided between the substrate 300 and the string selection line SSL. In other words, the ground selection line GSL is disposed between the common source line CSL and the uppermost one of the first word lines WL1, and the string selection line SSL is disposed between a bit line BL and the uppermost one of the second word lines WL2.

A device isolation pattern DSP provided in the separation trench 324. The device isolation pattern DSP may have a linear shape extending in the second direction D2. For example, the device isolation pattern DSP may include at least one of a silicon oxide layer, a silicon nitride layer, or a silicon oxynitride layer.

Active pillars AP may penetrate the stack structures ST. The active pillars AP penetrating each of the stack structures ST may be arranged in the second direction D2 when viewed from a plan view. The active pillars AP may correspond to vertical channel parts. In an embodiment, the active pillars form an active channel of a transistor.

In an embodiment, each of the active pillars AP is connected to the bit line BL and the common source line CSL. In an embodiment, bit line plugs PLG and pads PAD are disposed between the bit line BL and the stack structures ST for electrical connection therebetween.

Each of the active pillars AP includes vertical portions VP penetrating the stack structures ST, and a horizontal portion HP disposed under the stack structures ST to electrically connect the vertical portions VP to each other. The vertical portions VP are located in vertical holes 323 penetrating the stack structures ST. The horizontal portion HP is located in a horizontal recess region RC formed in an upper portion of the substrate 300. In an embodiment, one of the vertical portions VP is connected to the common source line CSL, and the other of the vertical portions VP is connected to the pad PAD connected to the bit line BL. In an embodiment, the horizontal portion HP is provided between the substrate 100 and the stack structures ST to electrically connect a pair of adjacent vertical portions VP to each other.

For example, in each of the active pillars AP, the vertical portions VP include a first vertical portion VP1 penetrating the first word lines WL1 and the ground selection line SSL, and a second vertical portion VP2 penetrating the second word lines WL2 and the string selection line SSL. In an embodiment, the first vertical portion VP1 is connected to the bit line BL (e.g., through a pad PAD), and the second vertical portion VP2 is connected to the common source line CSL. The horizontal portion HP may extend from under the second word lines WL2 to under the first word lines WL1 to electrically connect the first vertical portion VP1 to the second vertical portion VP2.

A data storage layer DS may be provided between each of the active pillars AP and the gate electrodes 320. A gate insulating layer GOX may be provided between the substrate 300 and the active pillar AP. The gate insulating layer GOX may include a silicon oxide layer.

Contacts (not shown) having the same structures as the contacts of the contact region WCTR described with reference to FIGS. 4 and 5 may be formed on the stack structures ST and the gate electrodes 320 which extend in the second direction D2.

An embodiment of the inventive concept can be described as a semiconductor device including a plurality of gate electrodes vertically stacked on a substrate, a semiconductor pattern penetrating though all of the gate electrodes, a bit line connected to the semiconductor pattern, and a plurality of word lines connected to the gate lines. In this embodiment, the word lines include a first number of conductive lines and a second number of conductive lines, where the first number of lines is disposed at a first depth from the substrate that is different from a the second number of lines disposed at a second depth from the substrate, and the depths differ from one another. The depths may be referred to as levels.

In an embodiment, the semiconductor pattern includes a first vertical shaped portion (e.g., see VP1 in FIG. 10) connected to the bit line, a second vertically shaped portion (e.g., see VP2 in FIG. 2) connected to a common source line CSL, and a horizontal portion (e.g., HP in FIG. 10) disposed within the substrate (e.g., see 300 in FIG. 10) connecting the first and second vertical shaped portions together. In an embodiment, a trench (e.g., see 324 of FIG. 10) is present between the first and second vertical shaped portions and contacts the horizontal portion.

Figure 11:
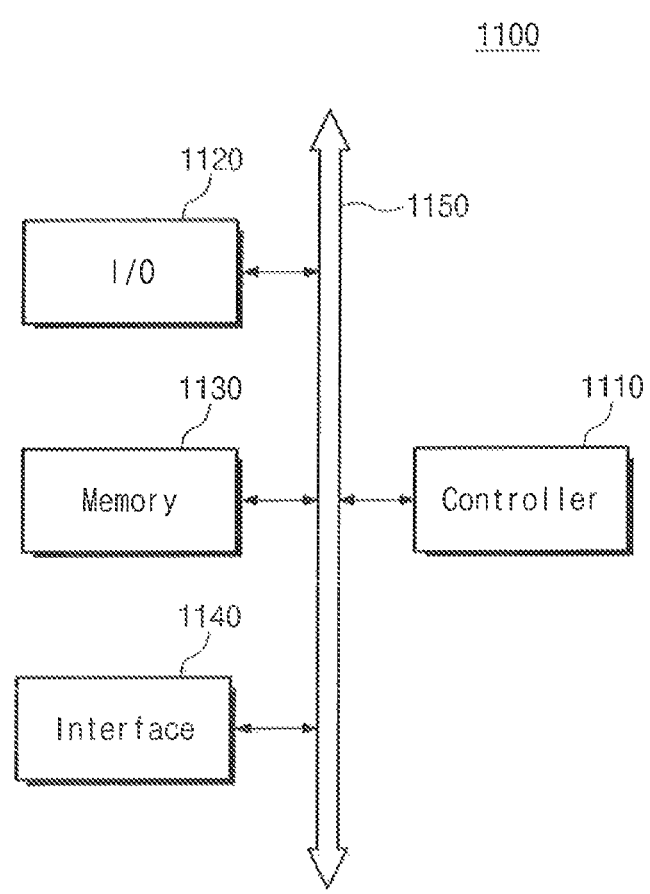
FIG. 11 is a schematic block diagram illustrating an example of an electronic system including a semiconductor memory device according to an exemplary embodiment of the inventive concept.

FIG. 11 is a schematic block diagram illustrating an example of an electronic system including a semiconductor memory device according to an exemplary embodiment of the inventive concept.

Referring to FIG. 11, an electronic system 1100 according to an embodiment of the inventive concept includes a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The memory device 1130 may include at least one of the semiconductor memory devices according to the aforementioned embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate wirelessly or using a physical cable. For example, the interface unit 1140 may include an antenna, a wired transceiver, or a wireless transceiver. Although not shown in the drawings, the electronic system 1100 may further include a fast dynamic random access memory (DRAM) device and/or a fast static random access memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, or other electronic products wirelessly receiving and/or transmitting information data.

Figure 12:
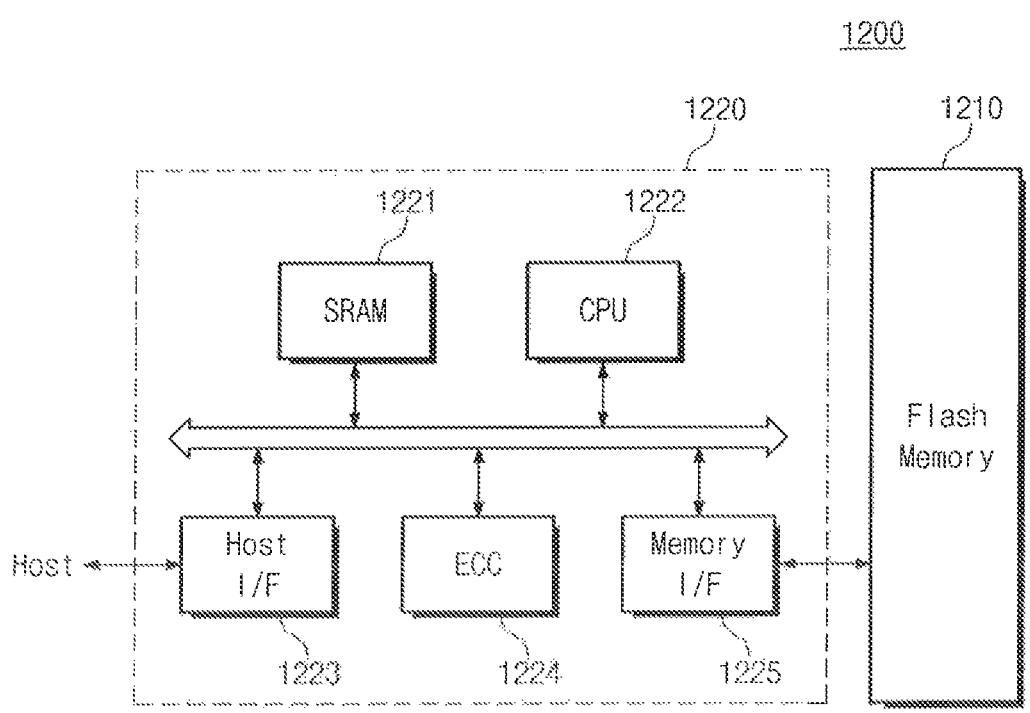
FIG. 12 is a schematic block diagram illustrating an example of a memory system including a semiconductor memory device according to an exemplary embodiment of the inventive concept.

FIG. 12 is a schematic block diagram illustrating an example of a memory system including a semiconductor memory device according to an exemplary embodiment of the inventive concepts.

Referring to FIG. 12, a memory system 1200 includes a memory device 1210. The memory device 1210 may include at least one of the semiconductor memory devices according to the embodiments mentioned above. In addition, the memory device 1210 may further include another type of a semiconductor memory device different from the semiconductor memory devices according to the embodiments described above. For example, the memory device 1210 may further include a DRAM device and/or a SRAM device. The memory system 1200 may include a memory controller 1220 that controls data communication between a host and the memory device 1210.

The memory controller 1220 includes a central processing unit (CPU) 1222 that controls overall operations of the memory system 1200. In addition, the memory controller 1220 includes an SRAM device 1221 used as a working memory of the CPU 1222. Moreover, the memory controller 1220 further includes a host interface unit 1223 and a memory interface unit 1225. The host interface unit 1223 may be configured to communicate between the memory system 1200 and the host using a data communication protocol. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory system 1200 may further include a read only memory (ROM) device that stores code data (e.g., executable codes) to interface with the host. The memory system 1200 may be used as a portable data storage card (e.g., a memory card). Alternatively, the memory card 1200 may be realized as solid state disk (SSD), which is used as a hard disk of a computer system.

In the semiconductor memory device according to embodiments of the inventive concepts, the conductive lines (e.g., the lower and upper word lines) connected to the cell gate electrodes has a multi-layered structure. Thus, the reliability of the semiconductor memory device may be improved.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A semiconductor memory device comprising:
   a first stack and a second stack on a substrate, the first stack includes a first gate electrode and a second gate electrode stacked on the substrate, the second stack includes a third gate electrode and a fourth gate electrode substantially stacked on the substrate;
   vertical channel parts penetrating the first stack and the second stack;
   a first conductive line connected with each of the first gate electrode and the third gate electrode;
   a first array pad connecting between the second gate electrode and fourth gate electrode on the first and the second stacks; and
   a second conductive line connected with the first array pad,
   wherein a level of the first conductive line from a top surface of the substrate is the same with a level of the first array pad from the top surface of the substrate,
   wherein a level of the second conductive line from the top surface of the substance is higher than the level of the first conductive line.

2. The semiconductor memory device of claim 1, wherein the first conductive line extends in a first direction,
   wherein the first array pad extends in a second direction crossing the first direction.

3. The semiconductor memory device of claim 1, wherein the first stack further includes a fifth gate electrode, and
   wherein the second stack further includes a sixth gate electrode,
   the semiconductor memory device further comprises a second array pad connecting between the fifth gate electrode and the sixth gate electrode,
   wherein the level of the first array pad is lower than a level of the second array pad from the top surface of the substrate.

4. The semiconductor memory device of claim 3, wherein the first array pad is parallel to the second array pad.

5. The semiconductor memory device of claim 1,
   wherein a width of the first conductive line is different from a width of the second conductive line.

6. The semiconductor memory device of claim 1, wherein the first stack further includes a fifth gate electrode, and
   wherein the second stack further includes a sixth gate electrode,
   the semiconductor memory device further comprises:
      a second conductive line connected with the first array pad on the first array pad; and
      a third conductive line connected with the fifth gate electrode and the sixth gate electrode,
   wherein the first, the second, and the third conductive lines are positioned at different levels from each other.

7. The semiconductor memory device of claim 1, further comprising:
   a second array pad connected with the first array pad on the first array pad; and
   a second conductive line connected with the second array pad on the second array pad,
   wherein the first conductive line and the second conductive line extends in a first direction,
   wherein the first array pad and the second array pad extends in a second direction crossing the first direction.

8. A semiconductor memory device comprising:
a first stack and a second stack on a substrate, the first stack includes a first gate electrode and a second gate electrode stacked on the substrate, the second stack includes a third gate electrode and a fourth gate electrode substantially stacked on the substrate;
vertical channel parts penetrating the first stack and the second stack;
a first array pad connecting between the first gate electrode and the third gate electrode;
a second array pad connecting between the second gate electrode and the fourth gate electrode;
a first conductive line connected with the first array pad; and
a second conductive line connected with the second array pad,
wherein the first array pad and the second array pad are positioned at different levels from a top surface of the substrate,
wherein the first conductive line and the second conductive line are positioned at different levels from the top surface of the substrate,
wherein the first conductive line is disposed on a level as the second array pad, and
wherein the second conducive line is disposed on a level above the first array pad and the second array pad.

9. The semiconductor memory device of claim 8,
wherein the first and second conductive lines extend in a first direction,
wherein the first and second array pads extend in a second direction crossing the first direction.

10. The semiconductor memory device of claim 8, further comprising a third array pad connected between the second array pad and the second conductive line,
wherein a level of the third array pad from the top surface of the substrate is positioned on the same level as the first conductive line.

11. The semiconductor memory device of claim 8, wherein the first stack further includes a fifth gate electrode, and
wherein the second stack further includes sixth gate electrode,
the semiconductor memory device further comprises:
a third conductive line connected with each of the fifth gate electrode and the sixth gate electrode,
wherein a level of the third conductive line from the top surface of the substrate is positioned at a same level with the levels of the first and the second array pads, and
wherein the level of the third conductive line is lower than the levels of the first and the second conductive lines.

12. The semiconductor memory device of claim 8, wherein the first stack further includes a fifth gate electrode, and wherein the second stack further includes sixth gate electrode, the semiconductor memory device further comprises:
a third conductive line connected with each of the fifth gate electrode and the sixth gate electrode,
wherein the first, the second, and the third conductive lines are positioned at different levels from each other.

* * * * *